(12) United States Patent
Stavenga et al.

(10) Patent No.: US 10,451,980 B2
(45) Date of Patent: **\*Oct. 22, 2019**

(54) SUBSTRATE TABLE, IMMERSION LITHOGRAPHIC APPARATUS AND DEVICE MANUFACTURING METHOD

(71) Applicant: ASML NETHERLANDS B.V., Veldhoven (NL)

(72) Inventors: Marco Koert Stavenga, Eindhoven (NL); Sergei Shulepov, Eindhoven (NL); Koen Steffens, Veldhoven (NL); Matheus Anna Karel Van Lierop, Eindhoven (NL); Samuel Bertrand Dominique David, Tilburg (NL); David Bessems, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 30 days.

This patent is subject to a terminal disclaimer.

(21) Appl. No.: 15/490,598

(22) Filed: Apr. 18, 2017

(65) Prior Publication Data

US 2017/0219936 A1    Aug. 3, 2017

Related U.S. Application Data

(63) Continuation of application No. 14/739,751, filed on Jun. 15, 2015, now Pat. No. 9,625,833, which is a
(Continued)

(51) Int. Cl.
*G03F 7/20* (2006.01)
*H01L 21/68* (2006.01)
*H01L 21/687* (2006.01)

(52) U.S. Cl.
CPC .......... *G03F 7/70716* (2013.01); *G03F 7/707* (2013.01); *G03F 7/70341* (2013.01);
(Continued)

(58) Field of Classification Search
CPC .. G02B 26/0833; G02B 27/0025; G02B 5/04; G02B 6/0008; G02B 6/0096; G02B 7/04;
(Continued)

(56) References Cited

U.S. PATENT DOCUMENTS

| 4,509,852 A | 4/1985 | Tabarelli et al. |
| 6,984,362 B2 | 1/2006 | Hara et al. |

(Continued)

FOREIGN PATENT DOCUMENTS

| EP | 1 420 300 A2 | 5/2004 |
| JP | 62-21170 U | 2/1987 |

(Continued)

OTHER PUBLICATIONS

Chinese Office Action dated Aug. 5, 2011 in corresponding Chinese Patent Application No. 201010132619.X.
(Continued)

*Primary Examiner* — Deoram Persaud
(74) *Attorney, Agent, or Firm* — Pillsbury Winthrop Shaw Pittman LLP

(57) ABSTRACT

A substrate table for an immersion lithographic apparatus is disclosed having a recess, configured to receive a substrate of a given size, and a fluid extraction system, configured to extract fluid from a gap between the edge of the substrate and the edge of the recess, the fluid extraction system configured such that the rate of flow of fluid extracted from a localized section of the gap is greater than the rate of flow of fluid extracted from another section of the gap.

21 Claims, 11 Drawing Sheets

Related U.S. Application Data continuation of application No. 12/721,867, filed on Mar. 11, 2010, now Pat. No. 9,059,228.

(60) Provisional application No. 61/168,359, filed on Apr. 10, 2009, provisional application No. 61/160,151, filed on Mar. 13, 2009.

(52) U.S. Cl.
CPC .......... G03F 7/70866 (2013.01); H01L 21/68 (2013.01); H01L 21/68735 (2013.01)

(58) Field of Classification Search
CPC ..... G02B 7/36; G02F 1/1303; G03F 7/70341; G03F 7/70641; G03F 7/707; G03F 7/70716; G03F 7/70866; H01L 21/68; H01L 21/68735

See application file for complete search history.

(56) References Cited

U.S. PATENT DOCUMENTS

| | | | |
|---|---|---|---|
| 8,351,018 B2 | 1/2013 | Direcks et al. | |
| 8,421,993 B2 | 4/2013 | Direcks et al. | |
| 9,059,228 B2 | 6/2015 | Stavenga et al. | |
| 2003/0008532 A1 | 1/2003 | Yuan et al. | |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0103830 A1* | 5/2006 | Holmes | G03F 7/70341 355/72 |
| 2006/0119809 A1 | 6/2006 | Verhagen et al. | |
| 2006/0139614 A1 | 6/2006 | Owa | |
| 2007/0109521 A1* | 5/2007 | Nishii | G03F 7/70341 355/72 |
| 2007/0177125 A1* | 8/2007 | Shibazaki | G03F 7/70341 355/72 |
| 2007/0229786 A1 | 10/2007 | Kemper et al. | |
| 2007/0269294 A1 | 11/2007 | Nagasaka et al. | |
| 2007/0273856 A1 | 11/2007 | Margeson | |
| 2008/0111984 A1 | 5/2008 | Shibuta | |
| 2008/0165331 A1 | 7/2008 | Jacobs et al. | |
| 2008/0187872 A1 | 8/2008 | Tsukamoto et al. | |
| 2008/0212046 A1 | 9/2008 | Riepen et al. | |
| 2009/0040481 A1 | 2/2009 | Nishikawara | |
| 2009/0109413 A1* | 4/2009 | Shibazaki | G03F 7/70341 355/30 |
| 2009/0296065 A1* | 12/2009 | Cloin | G03F 7/70341 355/71 |
| 2009/0296068 A1* | 12/2009 | Castelijns | G03F 7/70341 355/72 |
| 2010/0060868 A1 | 3/2010 | Tanasa et al. | |
| 2010/0214543 A1 | 8/2010 | Stavenga et al. | |
| 2011/0242512 A1* | 10/2011 | Kemper | G03B 27/42 355/30 |
| 2015/0277238 A1 | 10/2015 | Stavenga et al. | |

FOREIGN PATENT DOCUMENTS

| | | |
|---|---|---|
| JP | 2007-266603 | 10/2007 |
| WO | 99/49504 A1 | 9/1999 |
| WO | 2005/064405 | 7/2005 |
| WO | 2006/064851 | 6/2006 |

OTHER PUBLICATIONS

Japanese Office Action dated Jan. 17, 2012 in corresponding Japanese Patent Application No. 2010-048479.

* cited by examiner

SUBSTRATE TABLE, IMMERSION LITHOGRAPHIC APPARATUS AND DEVICE MANUFACTURING METHOD

This application is a continuation of co-pending U.S. patent application Ser. No. 14/739,751, filed on Jun. 15, 2015, which is a continuation of U.S. patent application Ser. No. 12/721,867, filed on Mar. 11, 2010, now U.S. Pat. No. 9,059,228, which claims priority and benefit under 35 U.S.C. § 119(e) to U.S. Provisional Patent Application No. 61/160,151, filed on Mar. 13, 2009, and to U.S. Provisional Patent Application No. 61/168,359, filed on Apr. 10, 2009. The content of each of the foregoing applications is incorporated herein in its entirety by reference.

FIELD

The present invention relates to a substrate table, an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

One difficulty with immersion technology may be caused by the formation of bubbles within the immersion fluid. In particular, if bubbles float into the space in between the substrate and projection system, defects may be introduced into the image formed on the substrate.

It is desirable, for example, to reduce or minimize the likelihood or impact of bubbles forming within an immersion lithographic apparatus or to remove all or a number of bubbles that do form before they can transfer to a position in which the bubbles may reduce the performance of the immersion lithographic apparatus.

According to an aspect of the invention, there is provided a substrate table for an immersion lithographic apparatus, comprising: a recess, configured to receive a substrate of a given size, the recess having a support region to support a lower surface of the substrate and an edge configured to be adjacent the edge of a substrate when it is supported by the support region; and a fluid extraction system, configured to extract fluid from a gap between the edge of the substrate and the edge of the recess, wherein the fluid extraction system is configured such that, in the absence of liquid, the rate of flow of fluid extracted from a localized section of the gap having a given length is greater than the rate of flow of fluid extracted from another section of the gap having the same length.

According to an aspect of the invention, there is provided a substrate table for an immersion lithographic apparatus, comprising: a recess, configured to receive a substrate of a given size, the recess having a support region to support a lower surface of the substrate and an edge configured to be adjacent the edge of a substrate when it is supported by the support region; and a fluid extraction system, configured to extract fluid from a gap between the edge of the substrate and the edge of the recess, wherein the fluid extraction system comprises a first duct opening into the gap, configured to extract fluid from the gap substantially all round the substrate, and a second duct, opening into the gap, configured to extract fluid from a localized section of the gap, wherein the smallest dimension of the cross-section of the first duct is smaller than the smallest dimension of the cross-section of the second duct at the point at which the first and second ducts open into the gap.

According to an aspect of the invention, there is provided a device manufacturing method, comprising projecting a patterned beam of radiation onto a substrate through a fluid provided in a space adjacent the substrate, wherein the substrate is supported in a recess on a substrate table, the method comprising extracting fluid from a gap between an edge of the recess and the edge of the substrate such that in the absence of liquid the rate of flow of fluid extracted from a localized section of the gap having a given length is greater than the rate of flow of fluid extracted from another section of the gap having the same length.

According to an aspect of the invention, there is provided a device manufacturing method, comprising projecting a patterned beam of radiation onto a substrate through a fluid provided in a space adjacent the substrate, wherein the substrate is supported in a recess on a substrate table, the method comprising extracting fluid from a gap between an edge of the recess and the edge of the substrate using a fluid extraction system that is configured to extract fluid from the gap, wherein the fluid extraction system comprises a first duct, opening into the gap, configured to extract fluid from the gap substantially all round the substrate, and a second duct, opening into the gap, configured to extract fluid from a localized section of the gap, wherein the smallest dimension of the cross-section of the first duct is smaller than the smallest dimension of the cross-section of the second duct at the point at which the first and second ducts open into the gap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
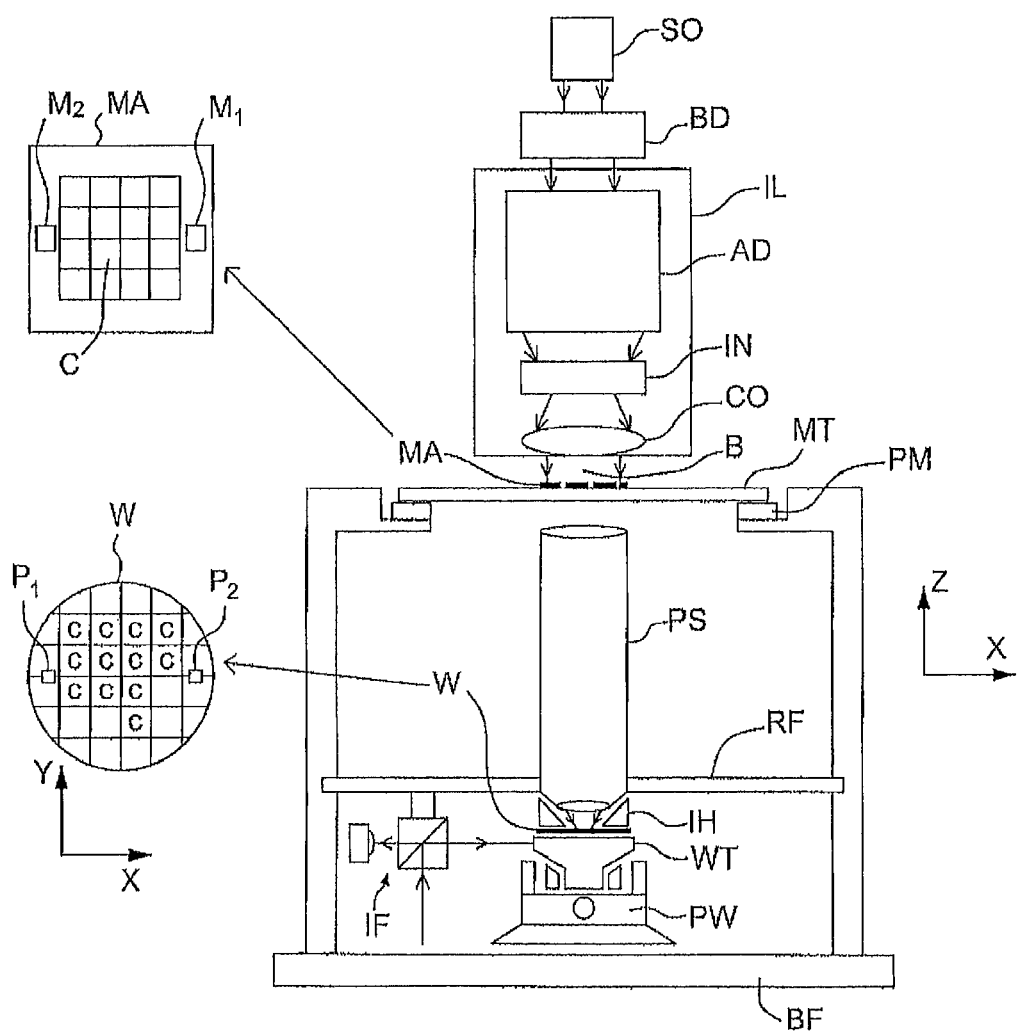
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
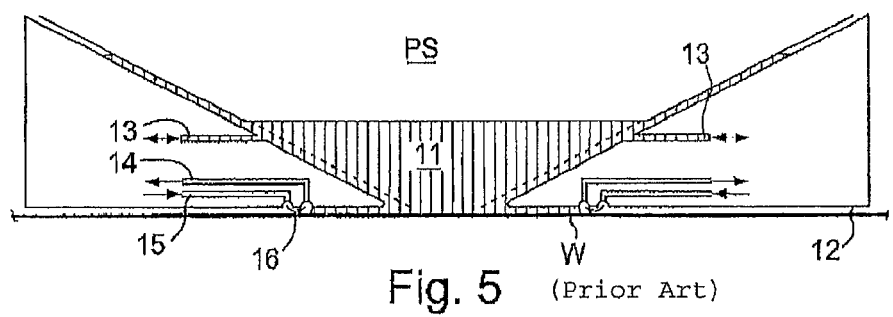
FIG. 5 depicts a further liquid supply system for use in a lithographic projection apparatus.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. In the cross-sectional view of FIG. 5, arrows illustrate the direction of fluid flow in and out of openings in the fluid confinement structure. The fluid confinement structure is substantially stationary relative to the projection system in the XY plane though there may be some relative movement in the Z direction (in the direction of the optical axis). A seal may be formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure or device with a body 12 forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a gas seal or fluid seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 µm, desirably 5 to 50 µm. In an embodiment, the porous material is at least slightly liquidphilic (e.g., hydrophilic), i.e. having a contact angle of less than 90° to the immersion liquid, e.g. water.

Another arrangement which is possible is one which works on a gas drag principle. The so-called gas drag principle has been described, for example, in United States patent application publication no. US 2008-0212046 and U.S. patent application No. 61/071,621 filed on 8 May 2008. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application No. 61/136,380 filed on 2 Sep. 2008.

Figure 2:
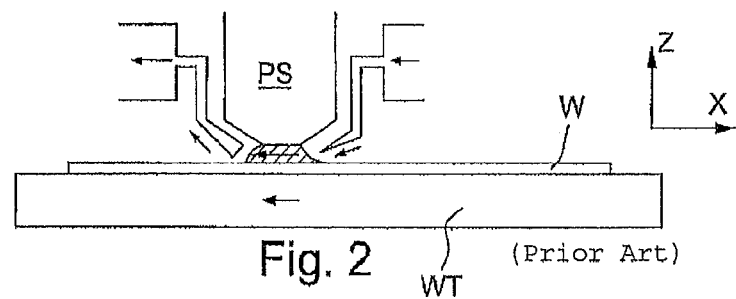
FIGS. 2 and 3 depict a liquid supply system for use in a lithographic projection apparatus.
Figure 3:
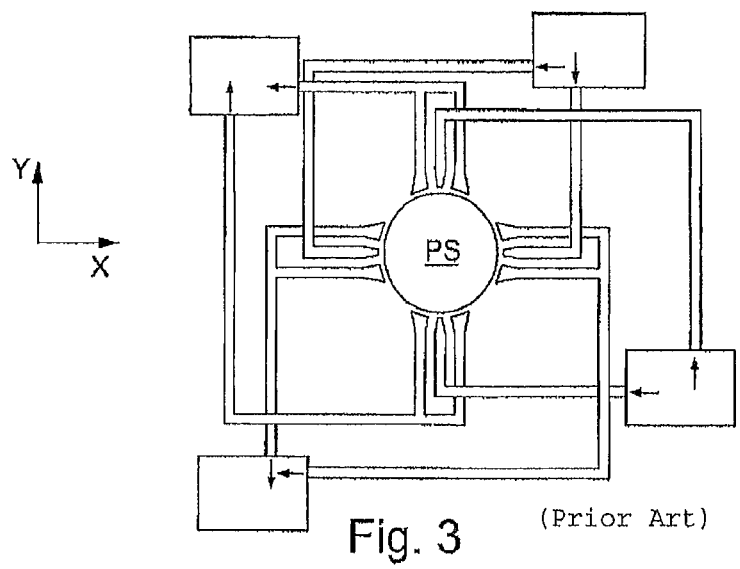
Figure 4:
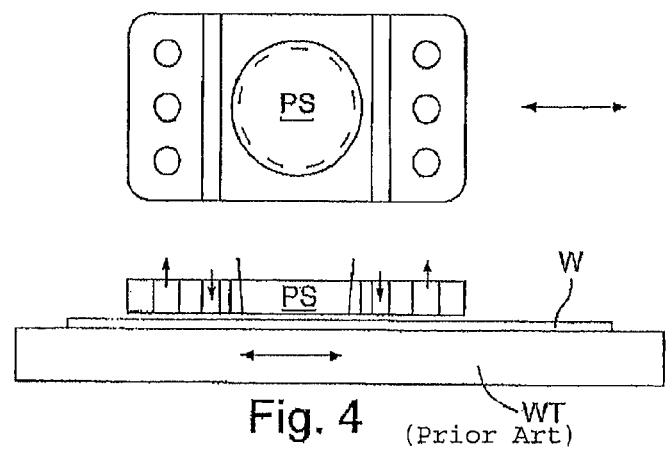
FIG. 4 depicts a further liquid supply system for use in a lithographic projection apparatus.

Many types of fluid handling structure are arranged to allow a flow of fluid across the space 11 between the final element of the projection system PS and the substrate W in a certain direction. For example, in the fluid handling system of FIGS. 2 and 3, this is achieved by providing a plurality of inlets and outlets surrounding the space and selectively providing or extracting liquid through those inlets or outlets to create the desired flow. In the case of the FIG. 5 embodiment, the liquid outlet 13 may comprise a plurality of openings for the flow of liquid therethrough in the body 12 of the fluid handling device which openings surround the space 11. Liquid can then be provided (or extracted) through those openings to provide a flow across the space 11 in the desired direction. A first set of openings may be provided for the provision of liquid to the space 11 and a second set of openings may be provided for extraction of liquid from the space 11. In the embodiment of FIGS. 2 and 3 (to which an embodiment of the present invention may be directed), the inlet and outlets can be considered as being a plurality of bodies each of which have a surface, which is provided with an opening for the flow of liquid therethrough.

Figure 6:
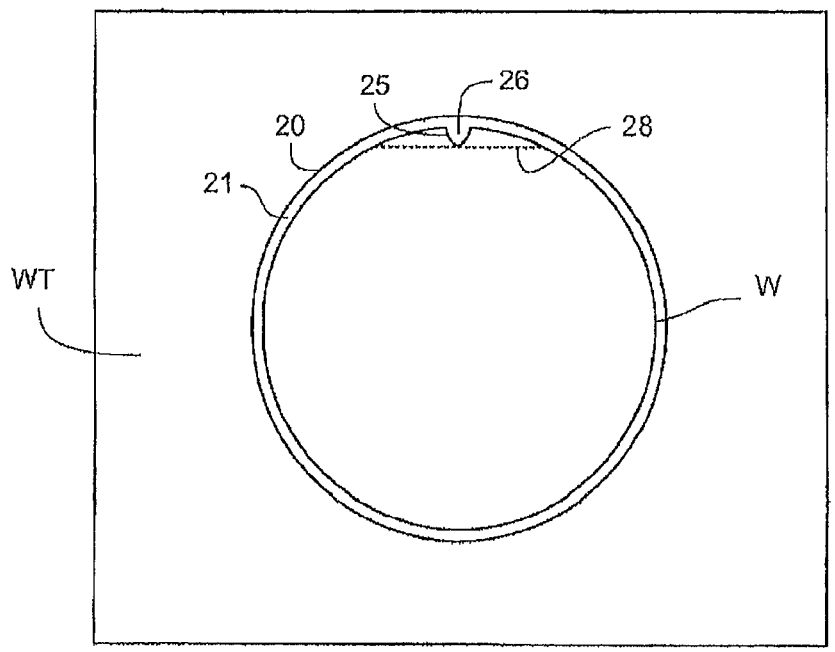
FIG. 6 depicts a substrate on a substrate table.

FIG. 6 depicts schematically a substrate table WT, according to an embodiment of the invention, to support a substrate W. The substrate table WT includes a recess 20 within which the substrate W fits. The recess 20 may have a support region to support the lower surface of the substrate W and an edge that is adjacent to the edge of the substrate W when the substrate is supported by the support region. The recess 20 may include a substrate holder.

In one arrangement, the recess is configured such that, when the substrate W is placed within the recess 20, the top surface of the substrate W is co-planar with the top surface of the substrate table WT. The recess 20 may be formed integrally as part of the substrate table WT. Alternatively, the recess 20 may be formed as an opening through a cover plate that forms the top surface of the substrate table WT.

During the operation of the immersion lithographic apparatus, the substrate table WT and substrate W move relative to the fluid handling structure in order to project the desired pattern of radiation through the immersion liquid onto different parts of the substrate W. During such movement, the edge of the substrate W will periodically traverse the fluid supplied or contained by the fluid handling system in the space between the projection system and the substrate table WT.

Although the recess 20 within the substrate table WT may be configured to receive a particular dimension of substrate W, there will be a finite gap between the edge of substrate W and the edge of the recess 20. For example, the gap may be of the order of 0.5 mm or less, for example in the range 0.2 mm to 0.5 mm, for example 0.5 mm, 0.3 mm or 0.2 mm. This gap 21 may result in the formation of bubbles in the immersion fluid. In particular, as the gap 21 passes under the immersion fluid handling system, gas may be trapped within the gap, resulting in the formation of bubbles which then rise up from the gap 21 into the immersion fluid between the projection system and the substrate W.

It has been proposed to extract fluid from the gap between the edge of the substrate W and the edge of the recess 20 to reduce the likelihood of the formation of bubbles within the gap 21 and, where such bubbles do form, to reduce the likelihood of the bubbles rising up from the gap 21. For example, it has been proposed to provide gap openings, through which to remove fluid from the gap during operation. The gap openings may be located near the edge of the recess 20, for example at a radially outward position to the substrate W.

However, although such an extraction system may be effective in some situations, in other situations it may not be fully effective.

As depicted in FIG. 6, a substrate W may include a positioning feature 25, such as a notch, which is used to orient the substrate W for various processing operations. At the point at which the positioning feature 25, such as the notch, is located, the gap 26 between the edge of the substrate W and the edge of the recess 20 is significantly larger than the gap 21 around the rest of the edge of the substrate W. For example, the gap at the notch may be up to approximately 1.5 mm, for example it may be 1.2 mm.

Where the gap between the edge of the substrate W and the edge of the recess 20 is increased as a result of such a positioning feature 25 on the edge of a substrate W, such a system to extract fluid from the gap may not be able to prevent bubbles forming in the gap 26 between the edge of the positioning feature 25, such as a notch, and the edge of the recess 20.

If a bubble does form within the gap 26 adjacent a positioning feature 25 on the edge of the substrate W, it may tend to increase in size such that a single larger bubble remains rather than plurality of bubbles forming.

Therefore, an embodiment of the invention provides a fluid extraction system to extract fluid from the gap between the edge of the substrate W and the edge of the recess 20 in which the extraction capacity for a localized section of the gap is greater than that for other sections of the gap, for example is greater than for adjacent sections of the gap between the edge of the substrate W and the edge of the recess 20.

In particular, the fluid extraction system may be configured such that the resistance to fluid flow from the gap is less in the localized section of the gap than in the other sections. Accordingly, under the same conditions, for example in the absence of liquid, the rate of flow of fluid extracted from the localized section is greater than the rate of low of fluid extracted from other sections of the gap having the same length as the localized section.

Therefore, a substrate W having a positioning feature 25, such as a notch, may be placed on the substrate table WT of an embodiment of the present invention such that the positioning feature 25 is aligned with the localized section having greater fluid extraction capacity. By arranging the substrate W in this manner, the greater fluid extraction capacity in the localized section of the gap between the edge of the substrate W and the edge of the recess 20 may help ensure that the likelihood of bubbles forming in the gap 26 between the edge of the positioning feature 25 on the edge of the substrate W and the edge of the recess 20 is sufficiently reduced and/or to help ensure that any bubbles that do form in this region do not rise up from the gap.

For example, the fluid extraction system may be configured such that a total of approximately 30 to 50 liters per minute of fluid is extracted from around the substrate between the edge of the substrate W and the edge of the recess 20. The additional fluid extraction capacity for the localized section aligned with the positioning feature 25 on the edge of the substrate W may be approximately 0.5 to 1 liter per minute of this overall fluid extraction capacity.

Although the positioning feature 25 on the edge of the substrate W as depicted in FIG. 6 may be a notch, it should be appreciated that other positioning features may be used and an embodiment of the present invention may be arranged to reduce the likelihood of bubble formation and/or the likelihood of bubbles being released from the gap in the region adjacent to such a positioning feature. For example, the substrate W may instead have a flat 28.

Figure 7:
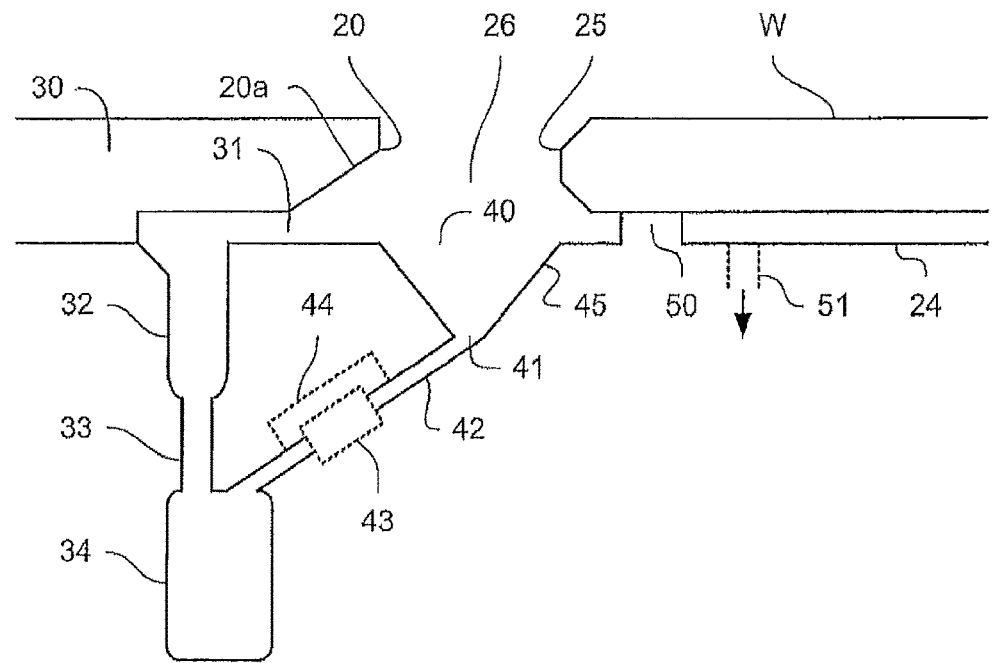
FIGS. 7 and 8 depict an arrangement of a fluid extraction system according to an embodiment of the invention.
Figure 8:
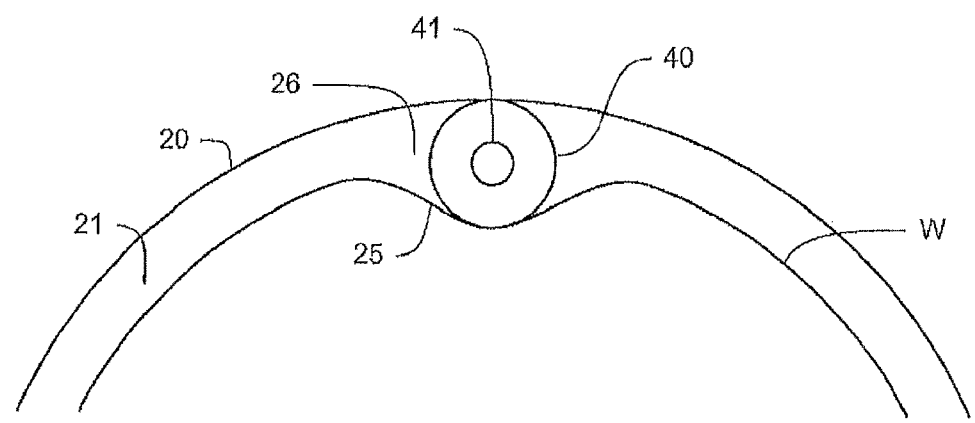

FIGS. 7 and 8 depict an arrangement of a fluid extraction system that may be used. In particular, FIG. 7 depicts a cross-section of a fluid extraction system at the localized section of the gap having increased extraction capacity. In the arrangement depicted, the recess 20 within which the substrate W is located is formed from an opening through a cover plate 30. FIG. 7 depicts a substrate W arranged such that the positioning feature 25, such as a notch or flat, is adjacent to the localized section of increased fluid extraction capacity. Accordingly, a relatively large gap 26 exists between the edge of the substrate W and the edge of the recess 20 at this point.

The fluid extraction system includes one or more first ducts 32 that open into the gap between the edge of the substrate W and the edge of the recess 20 at an opening 31 that opens directly into the gap 26. Accordingly, fluid may be extracted from the gap between the edge of the substrate W and the edge of the recess 20 without passing under the substrate W.

In a convenient arrangement, such as that depicted in FIG. 7, the opening 31 may be provided within the edge of the recess 20 such that extracted fluid is drawn away from the edge of the substrate W. In one arrangement, the opening 31 may be in the form of a slit-like opening in the edge of the recess 20 that surrounds the recess 20 and is connected for fluid flow to a first duct 32 that may include a ring-shaped channel. The first duct 32 may be connected by a series of passages 33 to an under-pressure source or a further channel 34 connected to an under-pressure source.

In one arrangement, the opening 31 in the edge of the recess 20 and surrounding the edge of the recess 20 may have a width of approximately 50 pm across. As shown, adjacent to the opening 31 in the edge of the recess 20, the edge of the recess 20 may include an inclined surface 20a. This may assist in preventing bubbles from rising from the gap between the edge of the substrate W and the edge of the recess 20.

Fluid is drawn from the gap between the edge of the substrate W and the recess 20 through the opening 31 and towards the under-pressure source. The extracted fluid may be gas when the gap is not passing under the fluid handling system, immersion fluid when the gap is passing under the fluid handling system, or a combination of both, for example immersion fluid having one or more bubbles entrained within the immersion fluid.

At the localized section of the gap between the edge of the substrate W and the edge of the recess 20, namely at the gap 26 between the positioning feature 25 of the substrate W when it is appropriately positioned and the edge of the recess 20, the extraction system includes a further opening 40, connected to a second duct 42 in order to provide the additional extraction capacity at this point in line with an embodiment of the present invention.

As shown in FIG. 7, the second duct 42 may be connected to the same under-pressure source or channel 34 as the first duct 32. Furthermore, a control valve 43 may be provided in the second duct 42 in order to control the fluid flow through the second duct 42.

For example, the control valve 43 may be closed when no positioning feature on the edge of a substrate W is located adjacent to the opening 40 of the second duct 42 into the gap between the edge of the substrate W and the edge of the recess 20. In such an arrangement, a bleed line 44 may be provided that bypasses the control valve 43. Such a bleed line may provide a constant small flow of fluid through the second duct 42 even when the control valve 43 is closed in order to ensure that, for example, no liquid remains trapped upstream of the control valve 43 within the second duct 42.

Alternatively or additionally, the control valve 43 may be used in order to adjust the increase of fluid extraction capability at the gap 26 between the edge of the substrate W at the positioning feature 25 and the edge of the recess 20 in comparison with the gap 21 between the edge of the substrate W not including a positioning feature and the edge of the recess 20.

It will be appreciated that it may be undesirable for fluid to pass under the substrate W. In particular, it may be desirable to prevent immersion fluid from passing under the substrate W. Accordingly, as explained above, the fluid extraction system may be configured such that fluid is extracted from the gap between the edge of the substrate W and the edge of the recess such that the fluid being extracted does not pass under the substrate W. Furthermore, at the edge of the support region 24 to support the substrate W, a seal 50 may be provided to prevent or reduce the flow of fluid from the gap between the edge of the substrate W and the edge of the recess 20 from passing along the under surface of the substrate W. As part of the seal 50, or in addition to it, one or more openings 51 may be provided for extraction of fluid. The one or more openings 51 may be present at or near the periphery of the recess 20. The one or more openings 51 may be arranged such that they are covered by the substrate W during operation such that fluid may be removed from under the substrate during operation. Therefore, any fluid that does pass under the substrate may be extracted.

FIG. 8 depicts in plan view the arrangement depicted in FIG. 7. As will be apparent from FIGS. 7 and 8, the opening 40 of the second duct 42 into the gap 26 between the positioning feature 25 on the edge of the substrate W and the edge of the recess 20 may be substantially the same size as the gap between the edge of the substrate W at the positioning feature 25 and the edge of the recess 20.

Such an arrangement may help ensure that any bubbles forming in the gap 26 between the edge of the substrate W at the positioning feature 25 and the edge of the recess 20 may be extracted through the second duct 42. Accordingly, the opening 40 of the second duct 42 into the gap 26 between the edge of the substrate W at the positioning feature 25 and the edge of the recess 20 may be up to, for example, 1.5 mm. In one arrangement, the opening may be approximately 1.2 mm across.

It may therefore be appreciated that the increased extraction capacity at the localized section of the gap 21 between the edge of the substrate W and the edge of the recess 20, at which the positioning feature 25 of the substrate W may be arranged, may be provided by the use of a second duct 42 having an opening 40 that is larger than the opening 31 connected to a first duct 32 that is used for fluid extraction from the remainder of the gap 21 between the edge of the substrate W and the edge of the recess 20. In particular, it will be appreciated that the smallest dimension of the cross-section of the opening 40 of the second duct 42 into the gap 26 between the edge of the substrate W and the edge of the recess 20 is larger than the smallest dimension of the cross-section of the opening 31 of the first duct 32 into the gap 21 between the edge of the substrate W and the edge of the recess 20.

As shown in FIGS. 7 and 8, the second duct 42 may be configured such that the cross-section of the second duct 42 decreases from the point at which it opens into the gap between the edge of the substrate W and the edge of the recess 20 to a point 41 downstream of the opening 40. This decrease in cross-sectional area may be provided to help ensure that the opening 40 into the gap between the edge of the substrate W and the edge of the recess 20 is sufficiently large to ensure that fluid is extracted from across the gap 26 between the edge of the substrate W at a positioning feature 25 and the edge of the recess 20, without an excessive drop in pressure along the second duct 42. This may be significant where, as depicted in FIG. 7, the second duct 42 is connected to the same under-pressure source or channel 34 as the first duct 32. If the second duct 42 were too large in cross-section along its length, the extraction of fluid through the first duct 32 from around the entirety of the gap 21 between the edge of the substrate W and the edge of the recess 20 may be significantly reduced. In turn, this may result in bubbles being released from the gap 21 between the edge of the substrate W and the edge of the recess 20 at locations away from the positioning feature 25.

Figure 9:
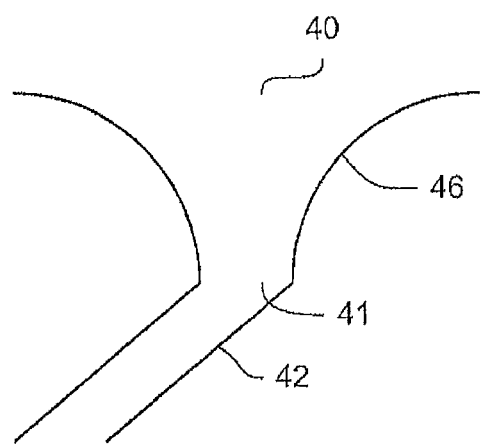
FIG. 9 depicts a variation of a feature of the fluid extraction system depicted in FIGS. 7 and 8.

As shown in FIGS. 7 and 8, the second duct 42 between the opening 40 into the gap 26 between the edge of the substrate W and the edge of the recess 20 at the positioning feature 25 and the second point 41 may be frustro-conical in shape, namely may have straight edges 45 in cross-section. However, it should be appreciated that other configurations of the second duct 42 may be used. For example, the second duct 42 between the opening 40 into the gap between the edge of the substrate W and the edge of the recess 20 and the second point 41 may be trumpet-shaped, namely may have curved edges 46 in cross-section, such as depicted in FIG. 9.

As explained above, the fluid extraction system of an embodiment of the invention may provide for increased fluid extraction from the gap between the edge of the substrate W and the edge of recess 20. Accordingly, when a substrate W is loaded to the substrate table WT, it may be oriented such that a positioning feature 25, such as a notch or a flat, is aligned with the localized section having increased fluid extraction capacity in order to reduce or minimize the likelihood of bubbles forming in the gap between the edge of the substrate W and the edge of the recess 20 in the region of the positioning feature 25.

It should be appreciated that in arrangements of the fluid extraction system described herein, one may provide additional localized sections having increased fluid extraction capacity, such that the substrate may be oriented in more than one position. For example, two localized sections having increased fluid extraction capacity may be provided such that the substrate W may be oriented in the recess 20 on the substrate table WT such that the positioning feature 25 on the edge of the substrate W may be aligned with either of the two localized sections of increased fluid extraction capacity.

It will be appreciated that by increasing the number of localized sections having increased fluid extraction capacity, one may increase the number of possible orientations of the substrate W on the substrate table WT at which the positioning feature 25 on the edge of the substrate W may be aligned with a localized section having increased fluid extraction capacity.

Figure 10:
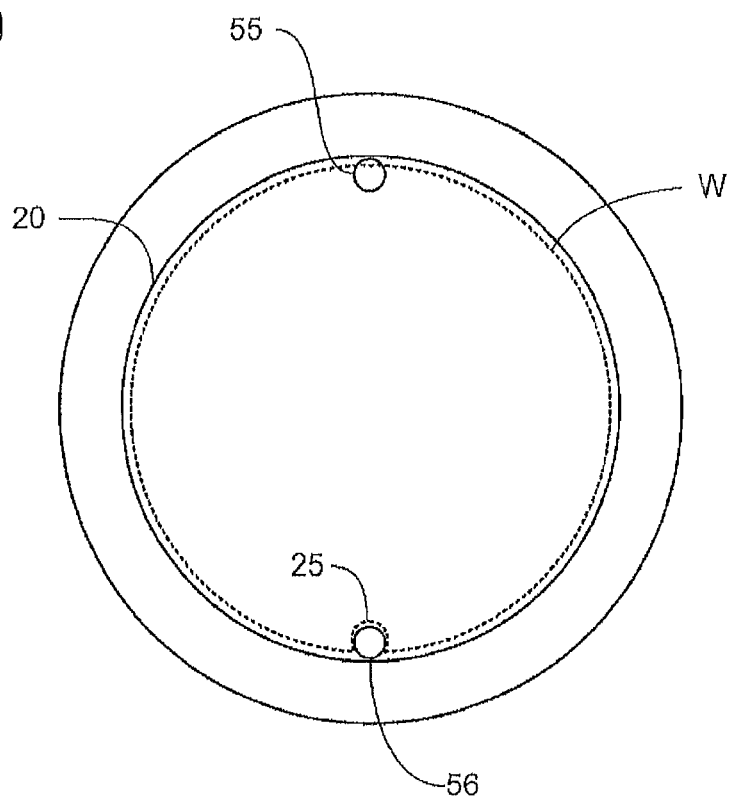
FIG. 10 depicts an optional arrangement of a fluid extraction system according to an embodiment of the invention.

FIG. 10 depicts in plan view a particular arrangement of part of a substrate table WT having a fluid extraction system with two localized sections of increased fluid extraction capacity. In particular, in the arrangement depicted in FIG. 10, two second ducts, such as those depicted in FIGS. 7 and 8, are provided and configured to open into the gap between the edge of the substrate W and the edge of the recess 20 at respective openings 55, 56. For clarity, the substrate W is shown in broken lines. As will be apparent, the substrate W may be oriented in one of two ways, while aligning the positioning feature 25 of the substrate W with one of the openings 55, 56. In an embodiment, only one of the openings 55, 56 provides the increased fluid extraction, i.e., one opening 55,56 provides increased fluid extraction while the other opening 55,56 does not.

In a further exemplary arrangement, four such openings, corresponding to sections of the fluid extraction system having increased fluid extraction capacity, may be provided and may be evenly spaced around the periphery of the recess 20 to receive the substrate W.

As explained above, each of the ducts associated with the additional openings used to provide additional fluid extraction capacity may include a control valve. Accordingly, the control valves associated with openings that are not aligned with a positioning feature 25 on the edge of a substrate W supported on the substrate table WT may be closed in order to prevent unnecessary additional fluid extraction.

It should further be appreciated that alternative arrangements of openings of the second duct 42 into the gap 26 between the edge of the substrate W and the edge of the recess 20 at a positioning feature 25 than those described above may be used. In particular, although the opening 40 into the gap 26 may be configured to be the same size as a positioning feature 25 expected to be provided on the edge of a substrate W, alternative arrangements may be provided. In particular, the opening 40 may be larger than the positioning feature 25 such that, for example, if there are minor variations in the placement of the substrate W on the substrate table WT or the size of the positioning feature 25, substantially all of the positioning feature 25 remains aligned with part of the opening 40.

Alternatively or additionally, although the opening 40 depicted in FIGS. 7 and 8 is substantially circular, it will be appreciated that this may not be the case. For example, other opening shapes, such as a slot may be provided. Likewise, a plurality of smaller openings may be provided adjacent to each other that together may be aligned with a positioning feature of a substrate W.

Figure 11:
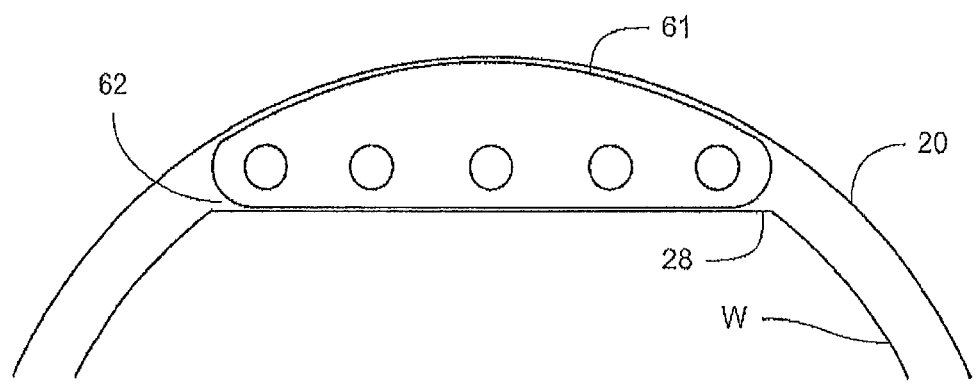
FIGS. 11 and 12 depict a further variation of a fluid extraction system according to an embodiment of the invention.
Figure 12:
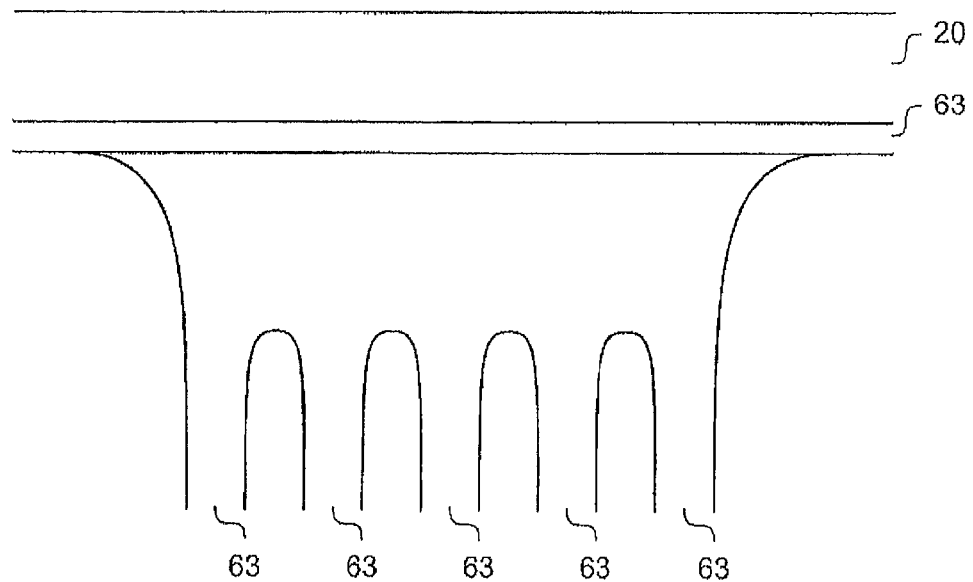

Furthermore, in other arrangements, a single opening may be connected to a plurality of second ducts used to provide increased fluid extraction capability within a localized section of the gap between the edge of the substrate W and the edge of the recess 20. An example of such an arrangement is depicted in FIGS. 11 and 12. In particular, as depicted, such an arrangement may be used, for example, if the positioning feature expected to be provided on the edge of a substrate W is a flat 28. In such an arrangement, as shown in FIG. 11 in plan view and as shown in FIG. 12 from the side looking from the substrate W towards the recess 20, an opening 61 may be provided that corresponds to the section of the gap 62 between the edge of the substrate W and the edge of the recess 20 at which the flat 28 is located. A plurality of second ducts 63 may be provided to connect the opening 61 to an under-pressure source, for example in a manner corresponding to that described above in relation to FIGS. 7 and 8.

It should further be appreciated that a fluid extraction system according to an embodiment of the present invention may include more than one arrangement to provide increased fluid extraction capacity in a localized area. For example, an arrangement such as that depicted in FIGS. 7 and 8 (or variants thereof) may be provided on one side of a substrate table WT and an arrangement such as that depicted in FIGS. 11 and 12 (or variants thereof) may be provided on the other side of the substrate table WT, permitting the use of substrates having different positioning features to be used with the one substrate table by appropriate orientation of the substrate W such that the positioning feature is aligned with the appropriate section of the fluid extraction system providing increased fluid extraction capacity.

As explained above, the fluid extraction system of an embodiment of the invention may be configured such that the outlets 31, 40 connected to the first and second ducts 32, 42, providing fluid extraction from all round the gap between the edge of the substrate W and the edge of the recess 20 and in a localized section, respectively, may be connected to a common under-pressure source or common channel 34 leading to an under-pressure source.

Figure 13:
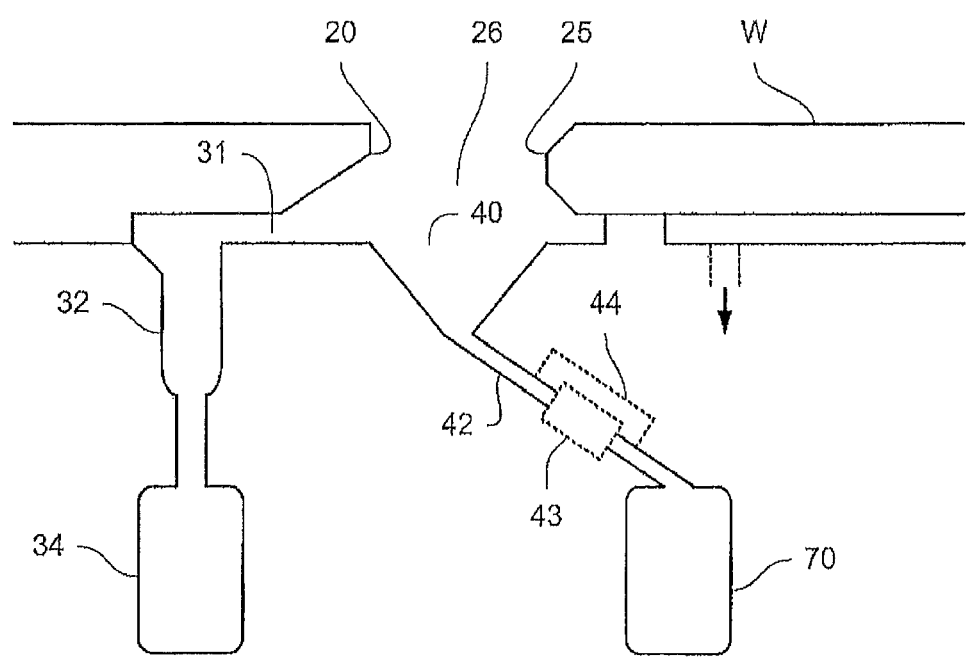
FIG. 13 depicts a further variation of a fluid extraction system according to an embodiment of the invention.

In an alternative arrangement, the second duct 42, opening into the gap 26 between the edge of the substrate W and the edge of the recess 20 at the positioning feature 25, is connected to a separate under-pressure source or channel 70 leading to a separate under-pressure source, as depicted in FIG. 13.

If a plurality of second ducts 42 are provided as discussed above, some or all of these second ducts 42 may share a common under-pressure source or may be connected to a common channel 70 leading to an under-pressure source. However, it should be appreciated that any or all of the second ducts 42 may have a dedicated under-pressure source.

It should further be appreciated that, in an arrangement having a plurality of second ducts 42, some may be connected to the same under-pressure source or channel connected to an under-pressure source as the first ducts 32, while others are connected to one or more separate under-pressure sources. In any such arrangement, it will be appreciated that one or more of the second ducts 42 may include a control valve 43 and may further include a bleed line 44 in a manner corresponding to that discussed above.

FIGS. 14 to 20 depict further arrangements of the fluid extraction system according an embodiment of the invention. In these arrangements, the fluid extraction system is configured to provide a localized section of the gap between the edge of the substrate W and the edge of the recess 20 with higher fluid extraction capacity than along the remainder of the gap between the edge of the substrate W and the edge of the recess 20 by the provision of an enlarged opening rather than by the provision of an additional opening as in the arrangements depicted in FIGS. 7 to 13 as discussed above.

Figure 14:
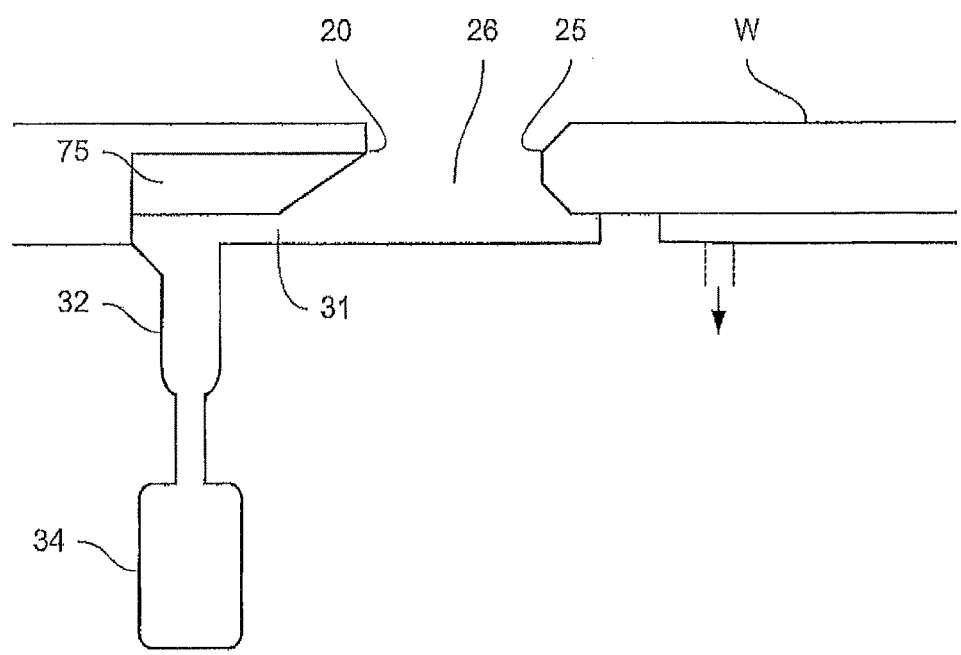
FIGS. 14 and 15 depict a further arrangement of a fluid extraction system according to an embodiment of the invention.
Figure 15:
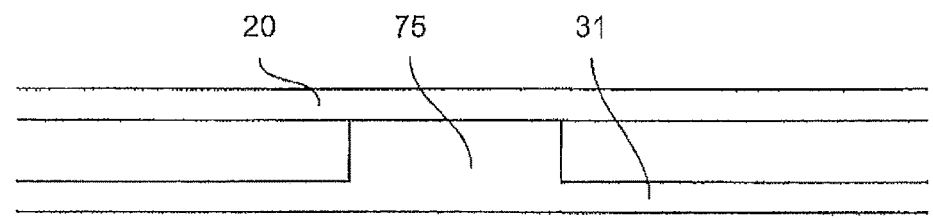

In particular, FIGS. 14 and 15 depict an arrangement in which a duct 32 opens into the gap between the edge of the substrate W and the edge of the recess 20 by means of an opening 31 that extends around the recess 20. The duct 32 is, in a similar manner to that discussed above, connected to an under-pressure source or channel 34 to an under-pressure source in order to extract fluid from the gap. In the localized area, corresponding to the position of a positioning feature 25 on the substrate W when appropriately placed on the substrate table, the opening into the duct 32 is enlarged, providing an enlarged opening 75.

FIG. 14 depicts a cross section of the fluid extraction system through the enlarged opening 75 connecting to the duct 32 and FIG. 15 depicts a front-on view of the enlarged opening 75 looking from the substrate W. As shown, the width of the enlarged opening 75 at the localized section of the gap between the substrate W and the edge of the recess 20 corresponding to the location of the positioning feature 25 is greater than the width of the opening 31 along the remainder of the opening. Accordingly, the resistance to fluid flow is lower at this point, resulting in a greater fluid flow from the gap between the edge of the substrate W and the edge of the recess 20 at this localized section of the gap.

Although, as depicted in FIG. 14, the enlarged opening 75 may have a substantially constant cross-sectional area extending into the edge of the recess 20 from the point at which it opens into the gap between the edge of the substrate W and the edge of the recess 20, this need not be the case. For example, as depicted in FIG. 16, the cross-sectional area of the opening 76 may decrease as it passes into the edge of the recess 20 from the point at which it opens into the gap 26 between the edge of the substrate W and the edge of the recess 20.

Figure 16:
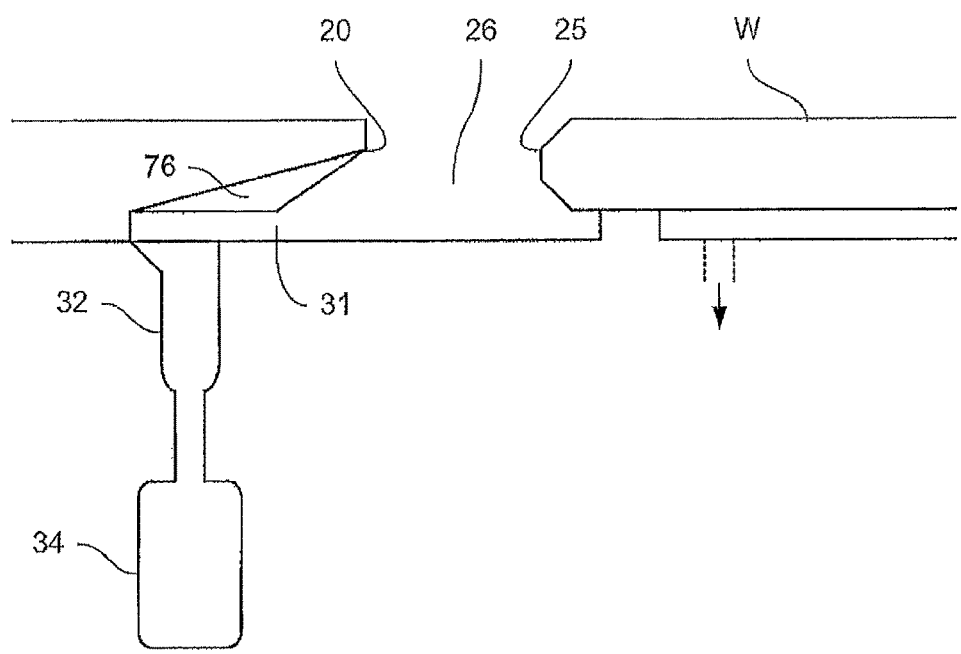
FIG. 16 depict a variation of the fluid extraction system depicted in FIGS. 14 and 15.
Figure 17:
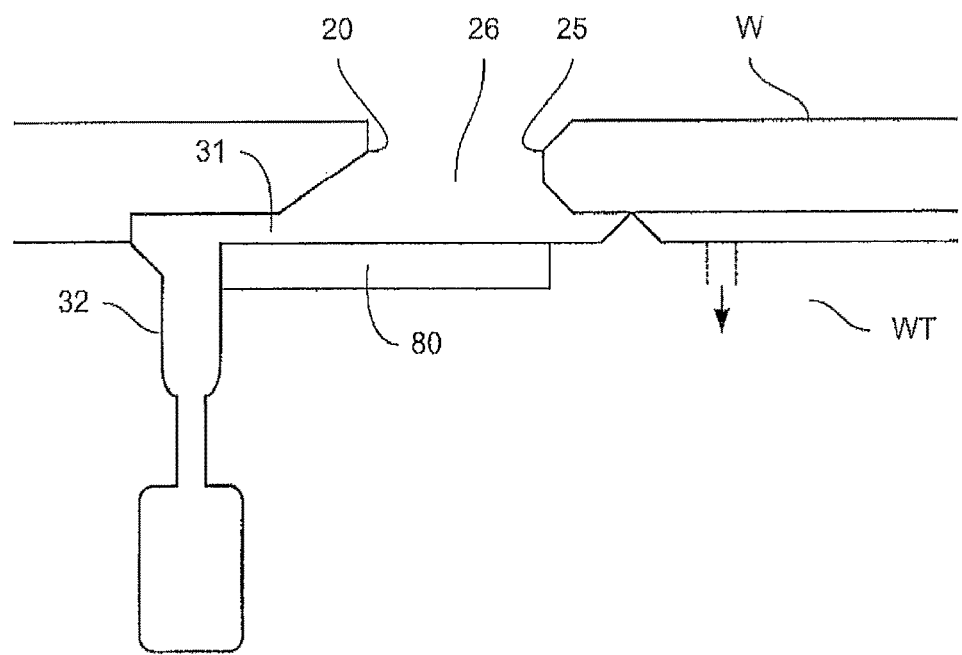
FIGS. 17 and 18 depict a variation of the fluid extraction system shown in FIGS. 14 and 15.
Figure 18:
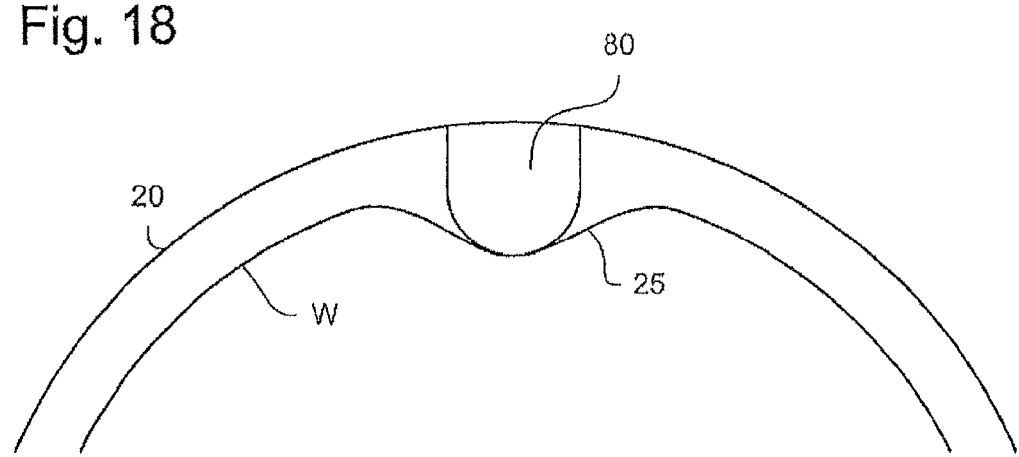

Likewise, although the arrangements depicted in FIGS. 14 to 16 depict the enlarged opening at the localized area providing enlarged fluid extraction capacity as being provided by the provision of an enlarged opening within the edge of the recess 20, the enlarged opening may, as depicted in FIG. 17 from the side and in FIG. 18 from the top, be provided alternatively or additionally by the provision of an additional recess 80 within the surface of the substrate table WT. In particular, the additional recess 80 may be positioned such that it is aligned with the positioning feature 25 of the substrate W when it is supported on the substrate table WT and extends, for example, into the edge of the recess 20 from a location adjacent to the edge of the substrate W at the positioning feature 25. Accordingly, in the region of the positioning feature 25 of the substrate W, the additional recess 80 and the opening 31 in the edge of the recess 20 combine together to produce an enlarged opening with the same effect as discussed above.

Figure 19:
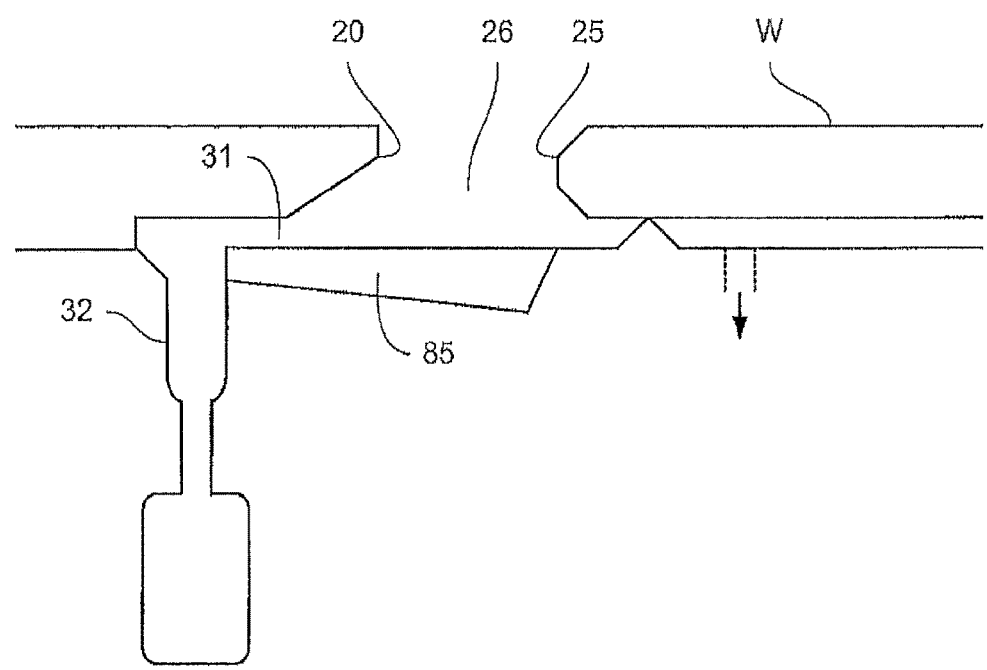
FIGS. 19 and 20 depict a further variation of the fluid extraction system shown in FIGS. 14 and 15.
Figure 20:
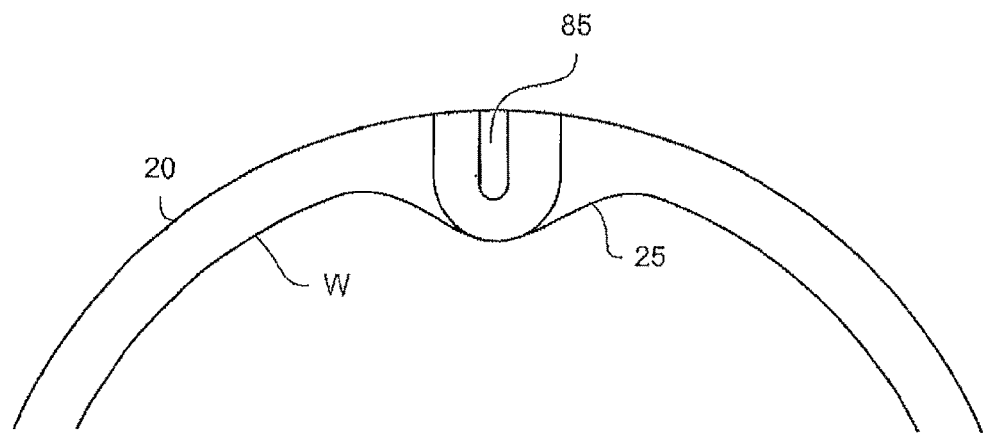

As depicted in FIGS. 19 and 20, the arrangement depicted in FIGS. 17 and 18 may be varied such that the cross-sectional area of the enlarged opening in the edge of the recess 20 adjacent to the positioning feature 25 of the substrate W decreases as it passes into the edge of the recess 20 from the point at which it opens into the gap 26 between the edge of the substrate W and the edge of the recess 20. As depicted in FIG. 19 from the side and in FIG. 20 from the top, such an arrangement may be provided by configuring the additional recess 85 such that it becomes shallower as it passes into the edge of the recess 20.

It should be appreciated that the enlarged opening in the region of the positioning feature 25 of the substrate W may be provided by a combination of one of the arrangements such as depicted in FIGS. 14 to 16 in which the opening in the edge of the recess 20 is enlarged at a localized section and one of the arrangements depicted in FIGS. 17 to 20, in which an additional recess is provided.

As with the fluid extraction systems described above in relation to FIGS. 7 to 13, it will be appreciated that fluid extraction systems depicted in FIGS. 14 to 20 may be configured to provide more than one localized section of the gap between the edge of the substrate W and the edge of the recess 20 with increased fluid extraction capacity.

It should also be appreciated that a fluid extraction system providing two or more localized sections of the gap between the edge of the substrate W and the edge of the recess 20 with increased fluid extraction capacity need not use the same arrangement for both such sections. Accordingly, any two or more of the above-described arrangements to provide increased fluid extraction capacity in a localized section of the gap may be used for different sections of the gap within one apparatus.

In one embodiment, there is provided, a substrate table for an immersion lithographic apparatus, comprising: a recess, configured to receive a substrate of a given size, the recess having a support region for supporting a lower surface of the substrate and an edge configured to be adjacent the edge of a substrate when it is supported by the support region; and a fluid extraction system, configured to extract fluid from a gap between the edge of the substrate and the edge of the recess; wherein the fluid extraction system is configured such that, in the absence of liquid, the rate of flow of fluid extracted from a localized section of the gap having a given length is greater than the rate of flow of fluid extracted from another section of the gap having the same length.

The fluid extraction system may comprise one or more first ducts, opening into the gap, configured to extract fluid from the gap substantially all round the substrate; and the fluid extraction system may comprise one or more second ducts, opening into the gap, configured to extract fluid from the localized section of the gap.

The smallest dimension of the cross-section of the one or more first ducts may be smaller than the smallest dimension of the cross-section of the one or more second ducts at the point at which the first and second ducts open into the gap.

In one embodiment, there is provided a substrate table for an immersion lithographic apparatus, comprising: a recess, configured to receive a substrate of a given size, the recess having a support region for supporting a lower surface of the substrate and an edge configured to be adjacent the edge of a substrate when it is supported by the support region; and a fluid extraction system, configured to extract fluid from a gap between the edge of the substrate and the edge of the recess; wherein the fluid extraction system comprises one or more first ducts opening into the gap, configured to extract fluid from the gap substantially all round the substrate; the fluid extraction system comprising one or more second ducts, opening into the gap, configured to extract fluid from a localized section of the gap; and the smallest dimension of the cross-section of the one or more first ducts is smaller than the smallest dimension of the cross-section of the one or more second ducts at the point at which the first and second ducts open into the gap.

The one or more first ducts may open into the gap by means of one or more openings in the edge of the recess.

The one or more first ducts may be connected for fluid flow to an opening in the edge of the recess that surrounds the recess.

The one or more second ducts may open into the gap by means of a corresponding opening formed in the surface of the substrate table between the support region and the edge of the recess.

The one or more second ducts may comprise a control valve, configured to control the flow of fluid through the one or more second ducts.

The one or more second ducts may comprise a bleed line that bypasses the control valve.

The first and second ducts may be connected to a common under-pressure source.

The one or more first ducts may be connected to a first under-pressure source and the one or more second ducts may be connected to a second under-pressure source.

The one or more second ducts may decrease in cross-section from the point at which the one or more second ducts open into the gap to a second point in the one or more second ducts, downstream from the point at which the one or more second ducts open into the gap.

The shape of the one or more second ducts from the point at which the one or more second ducts open into the gap to the second point may be a frustro-conical shape or a trumpet shape.

The fluid extraction system may comprise at least two second ducts and the at least two second ducts may open into the gap at respective openings that are set apart from each other.

The fluid extraction system may comprise at least two second ducts and the at least two second ducts may open into the gap at a common opening.

The substrate table may be configured to support a substrate having a positioning feature such that, when the substrate is supported by the support region, the positioning feature of the substrate is aligned with the opening of the one or more second ducts into the gap between the edge of the recess and the edge of the substrate such that fluid is drawn into the one or more second ducts directly from a space between the positioning feature of the substrate and the edge of the recess.

The substrate table may be configured to support a substrate having a positioning feature that is a notch, a flat or an indentation in the edge of the substrate.

The fluid extraction system may comprise one or more ducts, opening into the gap, configured to extract fluid from the gap substantially all round the substrate; and the one or more ducts may be connected for fluid flow to an opening in the edge of the recess that surrounds the recess; and the width of the opening may be greater at the localized section of the gap than the width of the opening along the remainder of the opening.

At the localized section, the opening through the edge of the recess may be enlarged such that its width is greater than along the remainder of the opening.

At the localized section, an additional recess may be formed in the substrate table and may be configured to adjoin a portion of the opening in the edge of the recess such that they combine to form an opening with a greater width than the width of the opening in the recess alone.

The fluid extraction system may be configured such that there are at least two localised sections of the gap at which the width of the opening is greater than along the rest of the gap such that the rate of flow of fluid extracted from a given length is greater than from another section of the gap.

In one embodiment, there is provided a substrate table for an immersion lithographic apparatus, comprising; a recess configured to receive a substrate with an edge having a positioning feature such that a gap is formed between an edge of the substrate and an edge of the recess; and an opening configured for the passage of fluid therethrough, the opening arranged in the substrate table such that, when a substrate is received within the recess, the opening is at least partly uncovered by the substrate and aligned with the positioning feature of the substrate.

In one embodiment, there is provide a substrate table for an immersion lithographic apparatus, comprising: a recess configured to receive a substrate with an edge having a positioning feature such that a gap is formed between the edge of the substrate and the edge of the recess; an opening provided in the substrate table and arranged to be located at the gap between the edge of the substrate and the edge of the recess when on the substrate table, wherein a dimension of the cross-section of the opening is substantially the length of the positioning feature on the substrate.

In one embodiment, there is provided a substrate table for an immersion lithographic apparatus, comprising: a recess configured to receive a substrate; an opening in the substrate table configured such that when the recess receives a substrate having a positioning feature, the opening is aligned with and corresponds to the positioning feature such that fluid may be extracted directly through the opening from a gap between the substrate and the edge of the recess at the positioning feature.

In a substrate table for an immersion lithographic apparatus as discussed above, the support region may comprise one or more support points, configured to support a portion of the lower surface of the substrate, and a seal, configured to be located at the edge of a substrate supported by the support region and configured to restrain liquid from substantially passing into under the substrate, wherein the seal may comprise a further fluid extraction system, configured to extract fluid from a space under the substrate and adjacent the edge of the substrate.

In one embodiment, there is provided an immersion lithographic apparatus comprising a substrate table as discussed above.

In one embodiment, there is provided an device manufacturing method, comprising projecting a patterned beam of radiation onto a substrate through a fluid provided in a space adjacent the substrate, wherein the substrate is supported in a recess on a substrate table; and extracting fluid from a gap between an edge of the recess and the edge of the substrate using a fluid extraction system that is configured to extract fluid from the gap, the fluid extraction system configured such that in the absence of liquid the rate of flow of fluid extracted from a localized section of the gap having a given length is greater than the rate of flow of fluid extracted from another section of the gap having the same length.

In one embodiment, there is provided a device manufacturing method, comprising projecting a patterned beam of radiation onto a substrate through a fluid provided in a space adjacent the substrate, wherein the substrate is supported in a recess on a substrate table; and extracting fluid from a gap between an edge of the recess and the edge of the substrate using a fluid extraction system that is configured to extract fluid from the gap, the fluid extraction system comprising one or more first ducts, opening into the gap, configured to extract fluid from the gap substantially all round the substrate, and one or more second ducts, opening into the gap, configured to extract fluid from a localized section of the gap, wherein the smallest dimension of the cross-section of one or more first ducts is smaller than the smallest dimension of the cross-section of one or more second ducts at the point at which the first and second ducts open into the gap.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table for an immersion lithographic apparatus, the substrate table comprising:
   a recess, configured to receive a substrate, the recess having a support region to support a lower surface of the substrate and an edge configured to be adjacent an edge of a substrate when it is supported by the support region; and
   a fluid extraction system, configured to extract fluid from a gap between the edge of the substrate and the edge of the recess,
   wherein the fluid extraction system comprises a first orifice in a surface of the substrate table, the first orifice facing upwardly and configured to drain liquid from the gap and a second orifice having a tapering side wall extending therefrom, the second orifice configured to drain liquid from the gap, the second orifice arranged such that, when the substrate is received within the recess, it is located outward of the edge of the substrate and outward, relative to a center of the substrate table, of the first orifice.

2. The substrate table of claim 1, wherein the second orifice, opening into the gap, is configured to extract fluid from the gap substantially all round the substrate, and the first orifice, opening into the gap, is configured to extract fluid from a localized section of the gap.

3. The substrate table of claim 1, wherein the smallest dimension of the cross-section of the first orifice at the point at which the first orifice opens into the gap is smaller than the smallest dimension of the cross-section of the second orifice at the point at which the second orifice opens into the gap.

4. The substrate table of claim 1, wherein the second orifice opens into the gap by being located in the edge of the recess.

5. The substrate table of claim 1, wherein the first orifice opens into the gap by being located in an upwardly facing surface of the substrate table between the support region and the edge of the recess.

6. The substrate table of claim 1, wherein the first and second orifices are connected to a common under-pressure source.

7. The substrate table of claim 1, wherein the second orifice decreases in cross-section from the point at which the second orifice opens into the gap to a second point in the second orifice, downstream from the point at which the second orifice opens into the gap.

8. The substrate table of claim 1, wherein the fluid extraction system comprises at least two first orifices and the at least two first orifices open into the gap at respective locations that are set apart from each other.

9. The substrate table of claim 1, wherein the support region comprises a support point, configured to support a portion of the lower surface of the substrate, and a seal, configured to be located at the edge of a substrate supported by the support region and configured to restrain liquid from substantially passing into under the substrate, wherein the seal comprises a further fluid extraction system, configured to extract fluid from a space under the substrate and adjacent the edge of the substrate.

10. The substrate table of claim 1, wherein the first orifice is arranged such that, when the substrate is received within the recess, the first orifice is underneath the substrate such that the substrate at least party overlaps the first orifice.

11. A substrate table for an immersion lithographic apparatus, the substrate table comprising:
a recess, configured to receive a substrate, the recess having a support region to support a lower surface of the substrate and an edge configured to be adjacent an edge of a substrate when it is supported by the support region; and
a fluid extraction system, configured to extract fluid from a gap between the edge of the substrate and the edge of the recess,
wherein the fluid extraction system comprises a first orifice defined in a surface exposed to the gap, the first orifice facing upwardly and configured to extract fluid from the gap and a second orifice defined in a surface exposed to the gap, the second orifice configured to extract fluid from the gap,
wherein the first orifice is arranged such that, when the substrate is received within the recess, the first orifice is underneath the substrate such that the substrate at least party overlaps the first orifice, and
the smallest dimension of the cross-section of the first orifice at the point at which the first orifice opens into the gap is smaller than the smallest dimension of the cross-section of the second orifice at the point at which the second orifice opens into the gap.

12. The substrate table of claim 11, wherein a duct to drain liquid passing through the first orifice extends at an angle to the horizontal.

13. The substrate table of claim 11, wherein the first and second orifices each drain liquid into a common channel within the substrate table.

14. The substrate table of claim 11, wherein a duct to drain liquid passing through the first orifice extends outward from the edge of the substrate in a direction with a direction component in the horizontal.

15. The substrate table of claim 11, wherein the second orifice decreases in cross-section from the point at which the second orifice opens into the gap to a second point in the second orifice, downstream from the point at which the second orifice opens into the gap.

16. The substrate table of claim 11, wherein the first orifice is defined in a surface at an angle to the horizontal.

17. The substrate table of claim 11, wherein the fluid extraction system comprises at least two first orifices and the at least two first orifices open into the gap at respective locations that are set apart from each other.

18. The substrate table of claim 11, wherein the support region comprises a support point, configured to support a portion of the lower surface of the substrate, and a seal, configured to be located at the edge of a substrate supported by the support region and configured to restrain liquid from substantially passing into under the substrate.

19. The substrate table of claim 11, wherein the second orifice is arranged such that, when the substrate is received within the recess, it is located outward of the edge of the substrate and outward, relative to a center of the substrate table, of the first orifice.

20. A substrate table for an immersion lithographic apparatus, the substrate table comprising:
a recess, configured to receive a substrate, the recess having a support region to support a lower surface of the substrate and an edge configured to be adjacent an edge of a substrate, when it is supported by the support region, so as to form a gap therebetween; and
a fluid extraction system, configured to extract fluid from the gap between the edge of the substrate and the edge of the recess;
a surface underneath the gap, wherein the surface has a first orifice therein, the first orifice facing upwardly and configured to drain liquid from the gap and the same surface defines a second orifice, the second orifice configured to drain liquid from the gap, the second orifice arranged such that, when the substrate is received within the recess, it is located outward of the edge of the substrate and outward, relative to a center of the substrate table, of the first orifice.

21. The substrate table of claim 20, wherein the first orifice is arranged such that, when the substrate is received within the recess, the first orifice is underneath the substrate such that the substrate at least party overlaps the first orifice.

* * * * *